(12) United States Patent
Chandra et al.

(10) Patent No.: US 11,062,071 B2
(45) Date of Patent: Jul. 13, 2021

(54) METHOD FOR SIMULATING A DYNAMIC SYSTEM

(71) Applicant: dSPACE digital signal processing and control engineering GmbH, Paderborn (DE)

(72) Inventors: Vivien Chandra, Paderborn (DE); Philip Grunert, Paderborn (DE)

(73) Assignee: DSPACE DIGITAL SIGNAL PROCESSING AND CONTROL ENGINEERING GMBH, Paderborn (DE)

(*) Notice: Subject to any disclaimer, the term of this patent is extended or adjusted under 35 U.S.C. 154(b) by 0 days.

(21) Appl. No.: 16/827,796

(22) Filed: Mar. 24, 2020

(65) Prior Publication Data

US 2020/0311330 A1    Oct. 1, 2020

(30) Foreign Application Priority Data

Mar. 27, 2019 (DE) .......................... 102019107817.2

(51) Int. Cl.
*G06F 30/343* (2020.01)
*G06F 17/16* (2006.01)
*G06F 30/3308* (2020.01)

(52) U.S. Cl.
CPC ............ *G06F 30/343* (2020.01); *G06F 17/16* (2013.01); *G06F 30/3308* (2020.01)

(58) Field of Classification Search
CPC ..... G06F 30/343; G06F 17/16; G06F 30/3308
See application file for complete search history.

(56) References Cited

U.S. PATENT DOCUMENTS

| 8,626,815 | B1* | 1/2014 | Langhammer | .......... G06F 17/16 708/607 |
| 9,558,156 | B1* | 1/2017 | Bekas | ...................... G06F 17/16 |
| 10,387,122 | B1* | 8/2019 | Olsen | ...................... G06F 17/16 |
| 2018/0157465 | A1* | 6/2018 | Bittner | .................. G06N 3/063 |

OTHER PUBLICATIONS

Sun et al., (Mapping Sparse Matrix-Vector Multiplication on FPGA, University of Tennessee, Oak Ridge National Laboratory, 2007, pp. 1-10) (Year: 2007).*
Pejovic, et al. "A Method for Fast Time-Domain Simulation of Networks with Switches," *IEEE Transactions on Power Electronics* 9, 4: 449-456 (Jul. 1994).

* cited by examiner

*Primary Examiner* — Nghia M Doan
(74) *Attorney, Agent, or Firm* — Leydig, Voit & Mayer, Ltd.

(57) ABSTRACT

A method for computer-based simulation or control of a dynamic system using a computer includes: cyclically receiving, by a programmable logic device, at least one input signal; calculating, by the programmable logic device, at least one matrix multiplication; and outputting, by the programmable logic device, at least one output signal. A configuration of the programmable logic device includes: a parallel multiplication of blocks of at least two elements of a matrix by at least one input-signal-dependent element of a vector, and an adder tree for multiplication results. Successive blocks of the matrix are temporarily stored in a pipeline and processed sequentially. A target number of blocks and a target adder stage are determined based on a number and/or values of parameters of at least one system equation. Processing of blocks for a current cycle is terminated based on the target number of blocks and the target adder stage being reached.

11 Claims, 8 Drawing Sheets

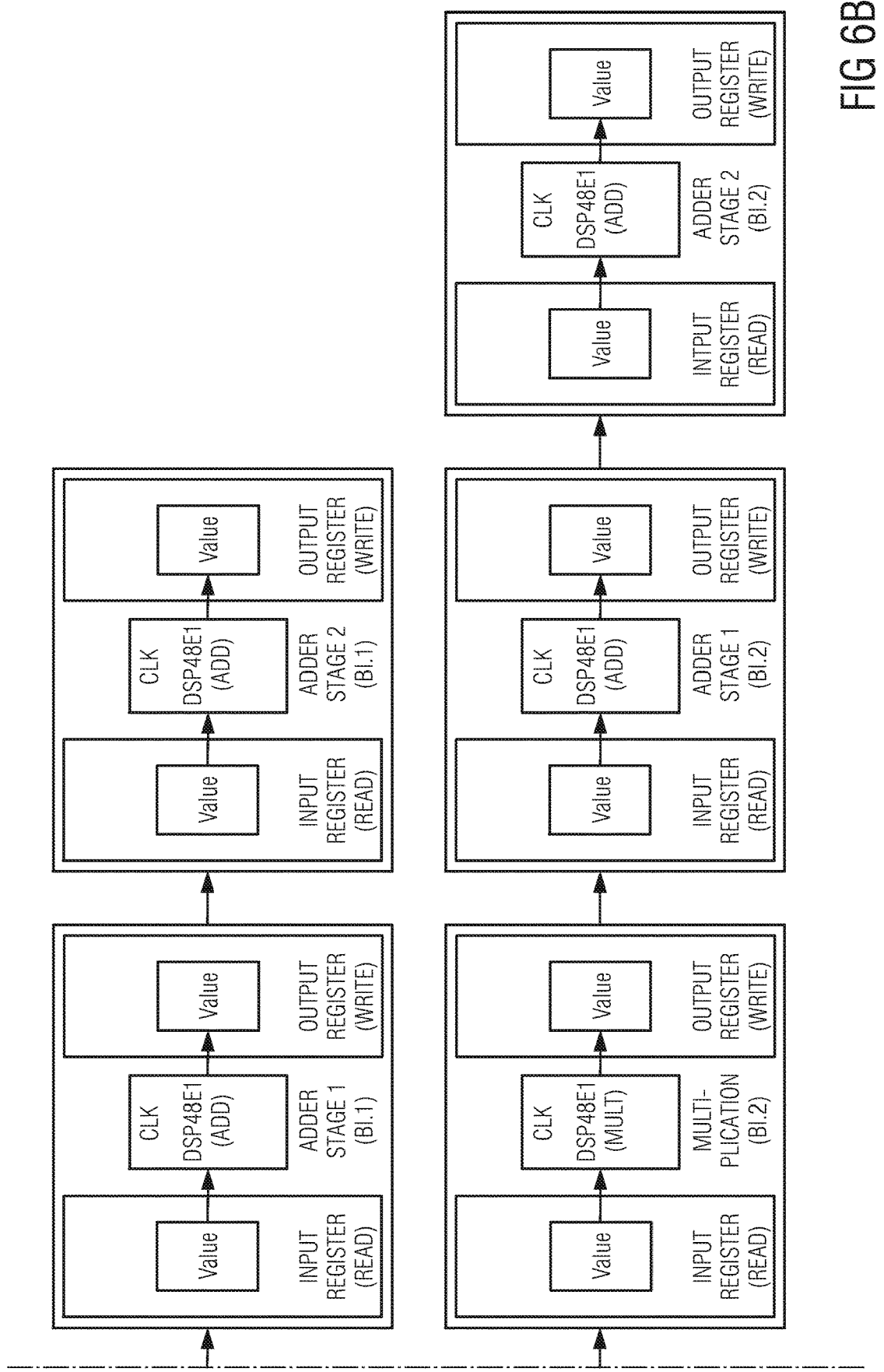

METHOD FOR SIMULATING A DYNAMIC SYSTEM

CROSS-REFERENCE TO PRIOR APPLICATIONS

Priority is claimed to German Patent Application No. DE 102019107817.2, filed on Mar. 27, 2019, the entire disclosure of which is hereby incorporated by reference herein.

FIELD

The invention relates to a method for simulating a dynamic system, a computer system and a non-transitory computer-readable storage medium.

BACKGROUND

Modern products, such as control units, are often developed with the aid of computer-based simulations of a dynamic system. On the one hand, it is possible to simulate the system controlled by a controller in order to test a component, such as a control unit, in a hardware-in-the-loop simulation prior to completion of the overall product. On the other hand, in rapid control prototyping, a prototype control unit can be used in a real environment for accelerated development of a control algorithm. In either case, special real-time computers are used that ensure a response within a predetermined maximum period of time. The system dynamics are often limited, so that, for example, a maximum latency in the range of milliseconds is appropriate and a working computer with a standard processor can be used.

However, for electrical and electronic systems, such as DC to DC voltage converters, inverters, smart grids or the control of an electric motor, the maximum permissible latency may be in the range of microseconds. In such cases, it is preferred to use a working computer having a programmable logic device, in particular a field programmable gate array (FPGA). It may also be provided that the control or a slower, higher-level closed-loop control be performed by a computing node having a processor that exchanges data with the programmable logic device. An FPGA is configured by reading a bit stream that directly influences the interconnection of the individual logic elements and thus determines the implemented circuit. This has the disadvantage that the creation of a configuration is complex and requires very time-consuming synthesis and implementation. It is therefore convenient to predefine a fixed FPGA configuration and to make adjustments only to the programming of the computing node.

A method for simulating electric circuits is described in the document entitled "A method for fast time-domain simulation of networks with switches," Pejovic and Maksimovic, IEEE Transactions on power electronics, vol. 9, No. 4, July 1994. The system equations can be solved by a matrix multiplication, where the number and values of the individual elements of the matrix are dependent on the properties of the specific circuit. Different approaches to efficient matrix multiplication, which are usually based on a sparse matrix, are known in the prior art. However, the matrices occurring in the simulation of electric circuits often do not fall into this category, so that the respective methods become inefficient.

SUMMARY

In an exemplary embodiment, the present invention provides a method for computer-based simulation or control of a dynamic system using a computer. Behavior of the dynamic system corresponds to at least one system equation. The computer includes a programmable logic device. The method comprises: cyclically receiving, by the programmable logic device, at least one input signal; calculating, by the programmable logic device, at least one matrix multiplication; and outputting, by the programmable logic device, at least one output signal. A configuration of the programmable logic device includes: a parallel multiplication of blocks of at least two elements of a matrix by at least one input-signal-dependent element of a vector, and an adder tree for multiplication results. Successive blocks of the matrix are temporarily stored in a pipeline and processed sequentially. A target number of blocks and a target adder stage are determined based on a number and/or values of parameters of the at least one system equation. Processing of blocks for a current cycle is terminated based on the target number of blocks and the target adder stage being reached. The at least one output signal is determined based on a result of the target adder stage.

BRIEF DESCRIPTION OF THE DRAWINGS

Embodiments of the present invention will be described in even greater detail below based on the exemplary figures. The present invention is not limited to the exemplary embodiments. All features described and/or illustrated herein can be used alone or combined in different combinations in embodiments of the present invention. The features and advantages of various embodiments of the present invention will become apparent by reading the following detailed description with reference to the attached drawings which illustrate the following.

DETAILED DESCRIPTION

Figure 1:
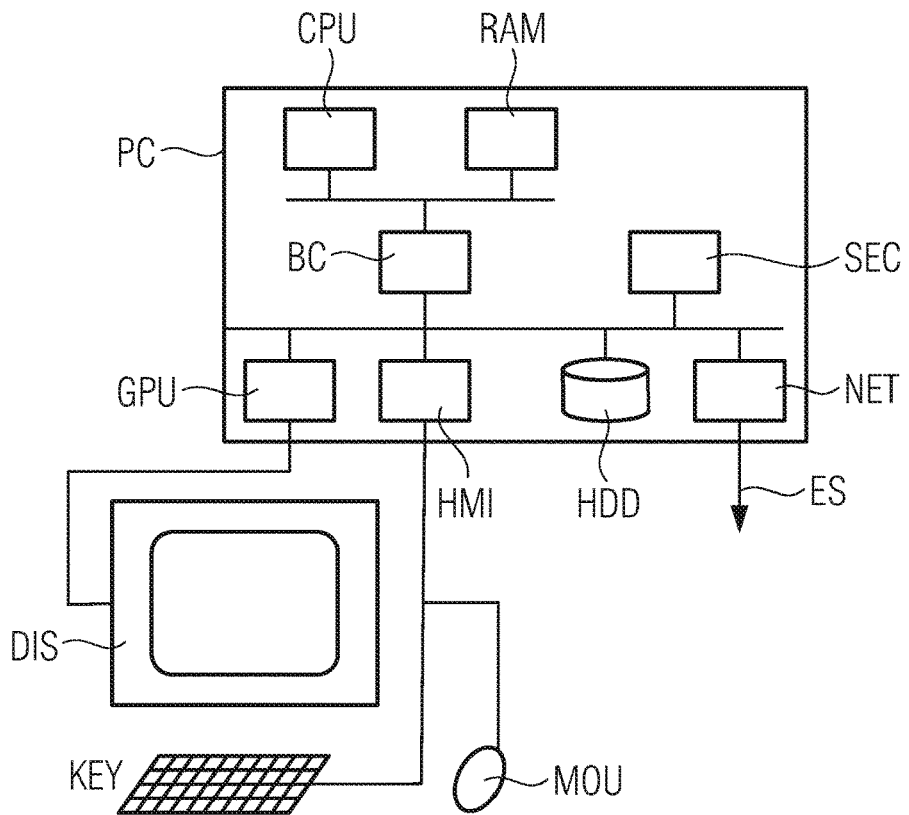
FIG. 1 shows an exemplary embodiment of an operator computer.

Exemplary embodiments of the invention provide a method and a device for simulating a dynamic system. Exemplary embodiments of the invention are able to dynamically reduce the cycle time or step size for small systems.

In an exemplary embodiment, the invention provides a method for computer-based simulation or control of a dynamic system, particularly an electric circuit, where the behavior is described by at least one system equation and the computer includes a processor and a programmable logic device. The programmable logic device is configured to cyclically receive at least one input signal and calculate at least one matrix multiplication and output at least one output signal. The configuration of the programmable logic device includes a parallel multiplication of blocks of at least two elements of the matrix by at least one input-signal-dependent element of a vector, and an adder tree for the multiplication results, successive blocks of the matrix being temporarily stored in a pipeline and processed sequentially. Based on the number and/or the values of parameters of the at least one system equation, a target number of blocks and a target adder stage are determined, the programmable logic device terminating the processing of blocks for the current cycle as soon as the target number of blocks and the target adder stage are reached and determining at least one output signal based on the result of the target adder stage.

This method advantageously enables dynamic adjustment of the cycle time or a reduction in step size in the simulation of small electric circuits. For this purpose, use is made of the fact that, depending on the number of components, the matrix of the system equation(s) may contain many zeros that can be disregarded. In this connection, the configuration of the programmable logic device can be predefined as a fixed configuration and can thus be used for any matrices up to the given maximum dimensions.

In an exemplary embodiment, the system equation is predefined via a graphical model, at least two elements of the matrix being defined by the system equation and/or the graphical model. The user may, for example, draw a diagram of the electric circuit to be simulated and specify circuit parameters. The elements of the matrix and thus also the target number of blocks as well as the target adder stage are determined based on an automatic analysis of the model according to methods known per se. The graphical representation provides a high degree of user comfort.

The data type of the input signal and/or the data type of the output signal and/or the data type of the elements of the matrix may be a floating-point type, such as, in particular, double. The method is applicable regardless of the data type and not limited to fixed-point types which are problematic in terms of accuracy and scaling.

In an exemplary embodiment, the attainment of the target number of blocks and/or the target adder stage is detected based on an abort signal. In an exemplary embodiment, the configuration is structured in different functional blocks, and the abort signal is then transmitted between individual functional blocks of the configuration. For example, the adder tree may constitute an independent functional block.

In an exemplary embodiment, the target number of blocks and/or the target adder stage and/or a size parameter are stored in an internal memory of the programmable logic device, and at least one functional block generates the abort signal in accordance with the stored value or values.

In an exemplary embodiment, the invention further provides a computer system including an operator computer having a human-machine interface and a working computer, the working computer including a processor and a programmable logic device and being adapted to perform an exemplary embodiment of the above-described method.

In an exemplary embodiment, the invention provides a non-transitory computer-readable storage medium having stored thereon a configuration that configures a programmable logic device to cyclically receive at least one input signal and calculate at least one matrix multiplication and output at least one output signal. The configuration includes a parallel multiplication of blocks of at least two elements of the matrix by at least one input-signal-dependent element of a vector, and an adder tree for the multiplication results, successive blocks of the matrix being temporarily stored in a pipeline and processed sequentially. The programmable logic device is further configured or adapted to receive at least one size parameter, to determine a target number of blocks and a target adder stage in accordance with the size parameter, to terminate the processing of blocks for the current cycle as soon as the target number of blocks and the target adder stage are reached, and to determine at least one output signal based on the result of the target adder stage.

In an exemplary embodiment, the programmable logic device is configured to store the elements of the matrix and/or the size parameter and/or the target number of blocks and/or the target adder stage in an internal memory.

In an exemplary embodiment, the computer-readable storage medium includes at least one non-volatile memory device that is electrically connected to a programmable logic device.

Exemplary embodiments of the invention will now be described in more detail with reference to the drawings, in which like parts are designated by the same reference numerals. The illustrated embodiments are highly schematic; i.e. the distances and dimensions are not true to scale and, unless indicated otherwise, do not have any derivable geometric relations to each other either.

FIG. 1 shows an exemplary embodiment of an operator computer PC. The operator computer has a processor CPU, which may, in particular, be implemented as a multi-core processor, a main memory RAM, and a bus controller BC. In an exemplary embodiment, operator computer PC is configured to be manually operated directly by a user, a monitor DIS being connected via a graphics card GPU, and a keyboard KEY and a mouse MOU being connected via a peripheral interface HMI. Operator computer PC may also have a touch interface. The operator computer further includes a non-volatile data storage device HDD, which may, in particular, be configured as a hard disk and/or solid-state disk, as well as an interface NET, in particular a network interface.

Interface NET allows connection of additional computers, such as, in particular, a working computer ES. One or more interfaces of any type, in particular wired interfaces, may be provided on operator computer PC and may each be used for connecting to other computers. Conveniently, a network interface according to the Ethernet standard may be used, where at least the physical layer is implemented in compliance with the standard. One or more higher protocol layers may also be implemented in a proprietary manner or in a manner adapted to the process computer. Interface NET may also be implemented in a wireless form, such as, in particular, as a wireless local are network (WLAN) interface or according to a standard such as Bluetooth. In an exemplary embodiment, this may also be a mobile cellular connection, such as Long-Term Evolution (LTE), where the exchanged data may be encrypted. It is advantageous if at least one interface of the operator computer is implemented as a standard Ethernet interface, so that other computers and/or servers can easily be connected to operator computer PC.

Operator computer PC may have a secure data container SEC, which facilitates the use of licensed applications and also allows the operator computer to be used as a license server for the working computer. Secure data container SEC may be implemented in the form of a dongle, for example, that is connected, in particular, to a peripheral interface. Alternatively, provision may be made for a secure data container SEC to be permanently integrated as a component in the operation computer or to be stored in the form of a file on non-volatile data storage device HDD.

Figure 2:
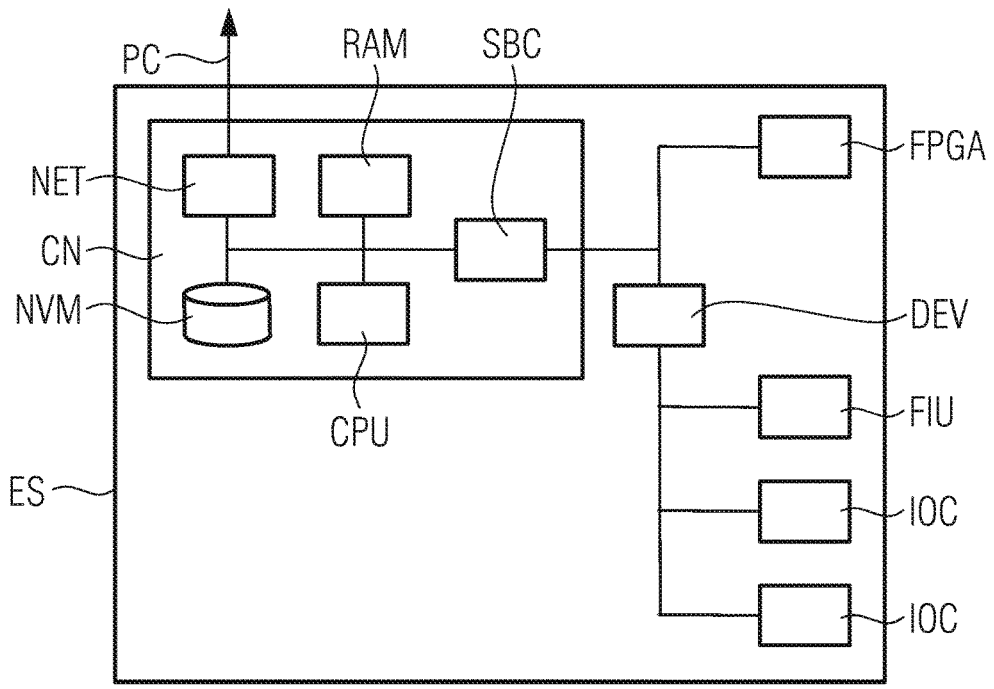
FIG. 2 shows an exemplary embodiment of a working computer.

FIG. 2 shows an exemplary embodiment of a working computer ES. This working computer includes a computing node CN that is connected to an operator computer PC via a network interface NET. The connection may exist only while the configuration of the process computer ES is adapted. In an exemplary embodiment, it exists permanently. The computing node CN has at least one processor CPU, particularly a multi-core processor, or multiple processors, a main memory RAM, and a non-volatile memory NVM that may store an operating system and/or a bootloader. At least one logic board FPGA and a device interface DEV are connected to the computing node via a high-speed bus SBC or a corresponding controller. Logic board FPGA includes a programmable logic device that can be configured in accordance with exemplary embodiments of the present invention. Provision may also be made for the working computer ES to have multiple logic boards FPGA or multiple programmable logic devices on a logic board. Device interface DEV can be used to connect a multiplicity of modules, such as a fault simulation circuit FIU that applies defined electrical faults to connected devices, or interface cards IOC, which provide one or more analog or digital I/O channels.

Figure 3:
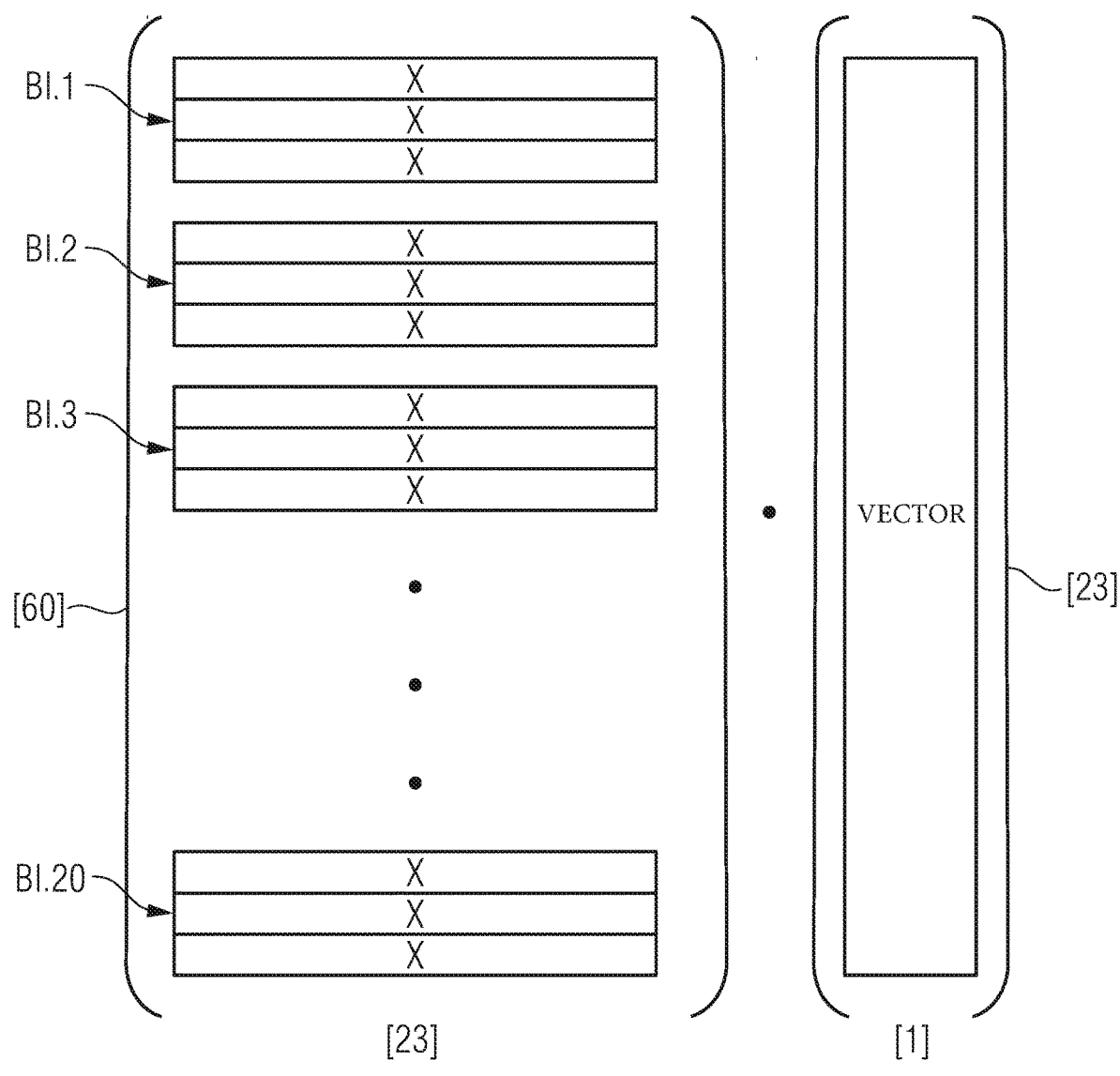
FIG. 3 shows a schematic representation of a matrix multiplication.

FIG. 3 schematically illustrates a matrix multiplication. Shown is a matrix of the dimension 60×23 that is multiplied by a vector of the height 23, where each row of the matrix is multiplied by the vector, and the values are then added. In the general case, all elements of the matrix must be taken into account since it is a priori not clear whether one or more of the elements are zero. In other words, all of the elements are data needed to calculate the result, which is indicated by the label "X" and gray shading.

When implementing the matrix multiplication on an FPGA, the matrix can be divided into blocks in order to reduce the calculation time. For example, a plurality of rows (or also a portion of a row) may be grouped into a block, the elements of the block being processed together or in parallel. Parallel processing of as many elements as possible reduces the number of required clock cycles, but requires larger areas on the FPGA. Depending on the FPGA device or the number of available logic elements, the practically usable block size is limited. Successive blocks are processed sequentially, it being possible to achieve accelerated processing or minimum possible latency through pipelining. The addition of the values is conveniently accomplished by the structure of an adder tree. An adder tree has a large number of parallel adder elements of a first stage, two each of which are connected to an adder element of a second stage. Two each adder elements of the second stage are connected to an adder element of the third stage, and this structure is repeated in subsequent stages until all addition results are accumulated in an adder element of the highest stage. Thus, the output value of this adder element indicates the sum over all input values of the adder elements of the first stage.

Figure 4:
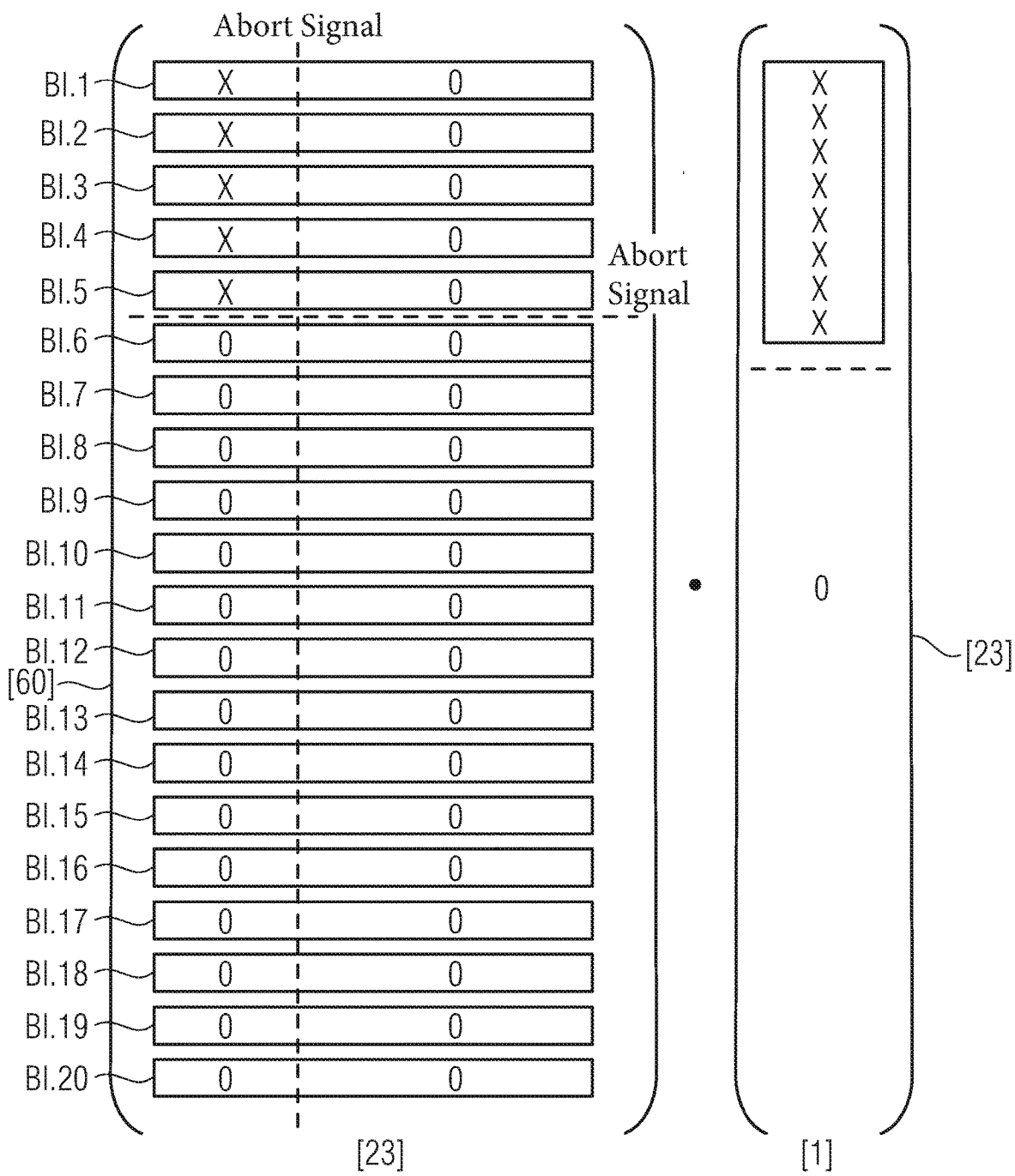
FIG. 4 shows a schematic representation of a matrix multiplication for a partially filled matrix.

FIG. 4 schematically illustrates a matrix multiplication for a partially filled matrix. Analogously to the previous figure, the matrix has the dimension 60×23, but only a submatrix of the dimension 15×8 contains elements with values to be taken into account; the 45 lower rows and the 15 last columns are filled with zeros and can be disregarded. Therefore, it is convenient to perform a multiplication only for the first 5 blocks of 3 rows each, and also to execute only a portion of the adder tree. This can be accomplished, for example, via abort signals, an abort signal being output when the boundary between necessary data and superfluous zeros is reached.

Figure 5:
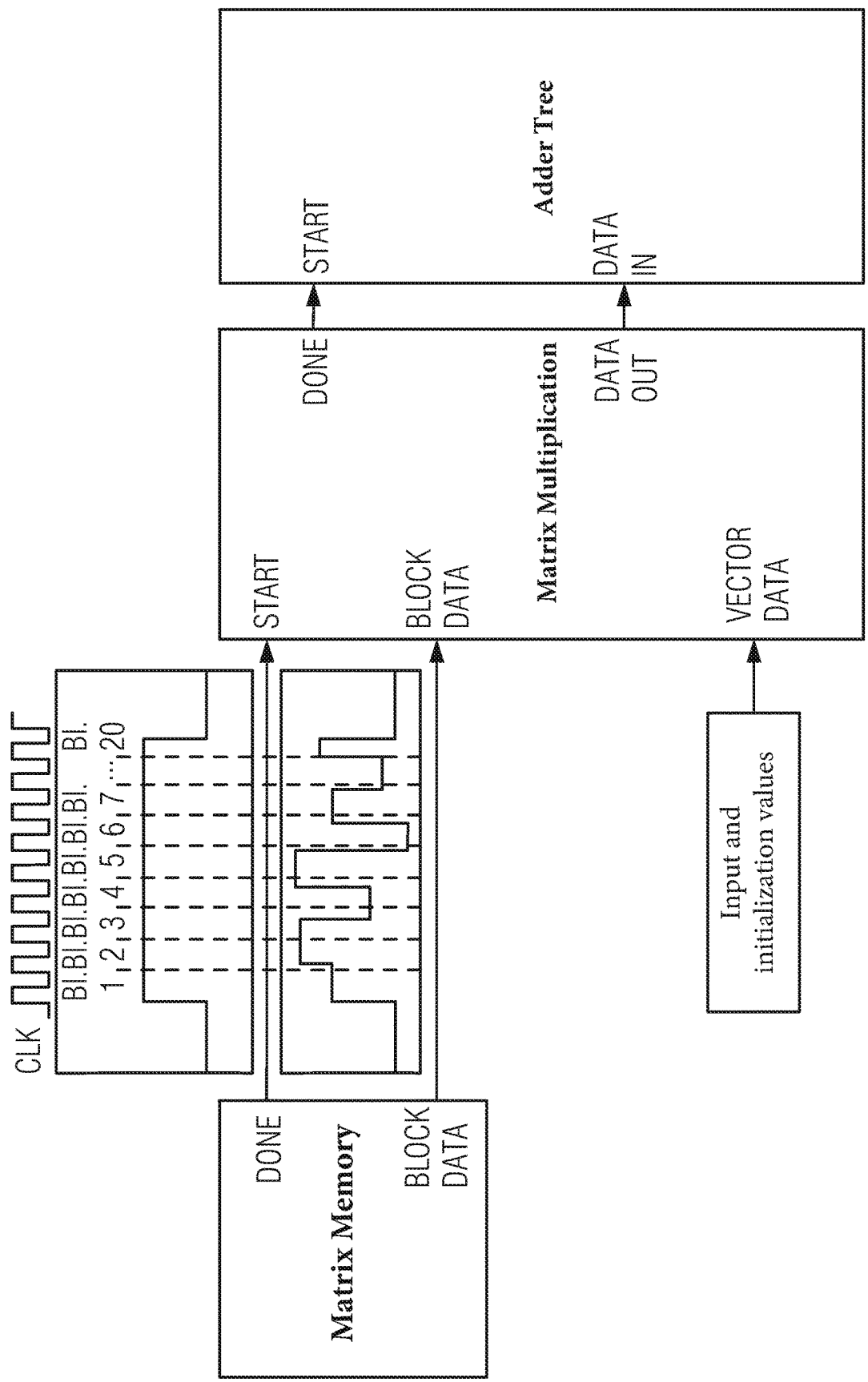
FIG. 5 shows a schematic representation of an FPGA configuration for a matrix multiplication according to an exemplary embodiment of the invention.

FIG. 5 schematically illustrates an FPGA configuration for a matrix multiplication according to an exemplary embodiment of the invention, which is organized in functional blocks: a matrix memory that stores the matrices needed for the calculations, a functional block for matrix multiplication, and an adder tree. The matrix memory is connected to the matrix multiplication functional block for the transfer of "BLOCK DATA"; i.e., blocks of matrix elements. Once the necessary data are transferred, an abort signal is transmitted to the subsequent functional block. To this end, the "DONE" output of the matrix memory is connected to a "START" input of the matrix multiplication functional block. The abort signal may also serve as a trigger for the subsequent functional block. The matrix multiplication functional block has an additional input "VECTOR DATA," via which the data of the vector to be multiplied are received. The matrix multiplication functional block is connected via a "DATA OUT" output and a "DONE" output to a "DATA IN" input and a START input of the adder tree, respectively. These are used to transfer the data to be added, and to indicate when all necessary data have been transferred and the addition can be started.

In order to calculate a block, the necessary matrix values are first read from the memory (matrix memory) and made available together with the vector data (input and initialization values) for the multiplication. The values are all read out in parallel within one clock cycle. When creating the configuration, the ARRAY PARTITION pragma in VIVADO HLS (a high-level-language development environment for FPGA configurations), for example, may be used to configure the memory accordingly. This allows all necessary block value multiplication operations of the values of a block to occur in parallel. The final addition is performed using an adder tree. For efficient calculation of multiple blocks, pipelining may be used so that after each clock cycle, the calculation for a new block can be started.

As shown in FIG. 5, the whole matrix may be stored in a memory of the programmable logic device. Each cycle, a new block of the matrix can be read out and processed in the pipeline. The values to be multiplied by the matrix are received from the processor of the working computer, assembled to a vector, and temporarily stored in a buffer. The programmable logic device is configured to at least temporarily store successive blocks of the matrix and to process the successive blocks sequentially in a pipeline.

Figure 6:
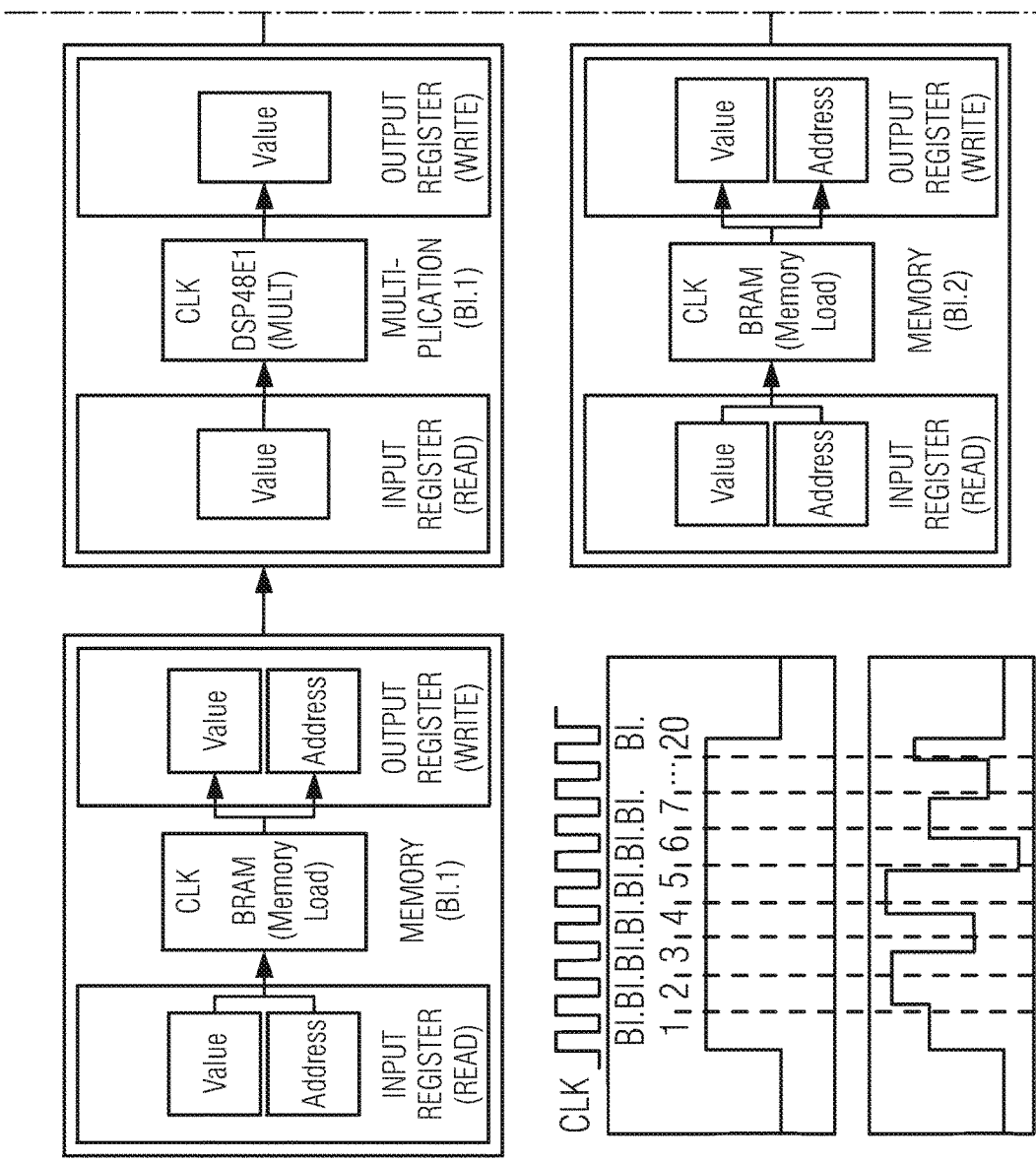
FIGS. 6A and 6B show a hardware-oriented representation of the pipelining for a matrix multiplication according to an exemplary embodiment of the invention.

In an embodiment, the large functional blocks, namely matrix memory, matrix multiplication, and adder tree, may conveniently be implemented in VIVADO HLS, and the activation of the abort mechanism may be accomplished by way of a self-programmed logic circuit in XSG. The functional blocks may be set up for pipelining using a pragma functionality available in VIVADO HLS by specifying the "PIPELINE" pragma to add additional register stages. FIG. 6 illustrates a detailed example of the registers "INPUT REGISTER," "OUTPUT REGISTER" added for the temporary storage of necessary data. For example, for the matrix memory, the required memory address is first stored in a register, where it is used for loading the values. The values read out in this way are stored in an output register and made available for the next step (here multiplication). This provides a decoupling of the individual steps from each other and allows the processing of the second block to be started before the first block is completed. This allows successive matrix blocks to be processed at intervals of only one clock cycle and to optimize throughput.

FIG. 6 shows a hardware-oriented pipelining scheme for a matrix multiplication according to an exemplary embodiment of the invention. The details of the execution are as follows: When reading from the memory ("BRAM (Memory Load)"), the required address is first read into a register ("INPUT REGISTER (READ)") to subsequently load the value and write it into the output registers ("OUTPUT REGISTER (WRITE)"). In the multiplication phase, these values are temporarily stored in a register again ("INPUT REGISTER (READ)") to subsequently multiply them via a DSP element ("DSP48e1 (MULT)"). Again, the result is written into an output register ("OUTPUT REGISTER (WRITE)") and thus made available for the addition. The various stages of the adder tree also follow a corresponding scheme including reading the input values from a register ("INPUT REGISTER (READ)"), performing the calculation in a DSP element ("DSP48e1 (ADD)"), and writing the output value into a register ("OUTPUT REGISTER (WRITE)"). The diagram indicates only one DSP element per stage; in practice, multiple DSP elements per arithmetic operation may be required for each element of the row (or block). Depending on the number of elements per row (or block), more than the two adder stages shown may be required.

In the lower half of the scheme, the sequential transfer of data of successive blocks (BL. 1 through BL. 20) is shown against a clock signal (CLK). The pipelining allows the reading of the data for the second block to be started immediately after the reading of the data for the first block. The further procedure corresponds to that for the data of the first block.

Figure 7:
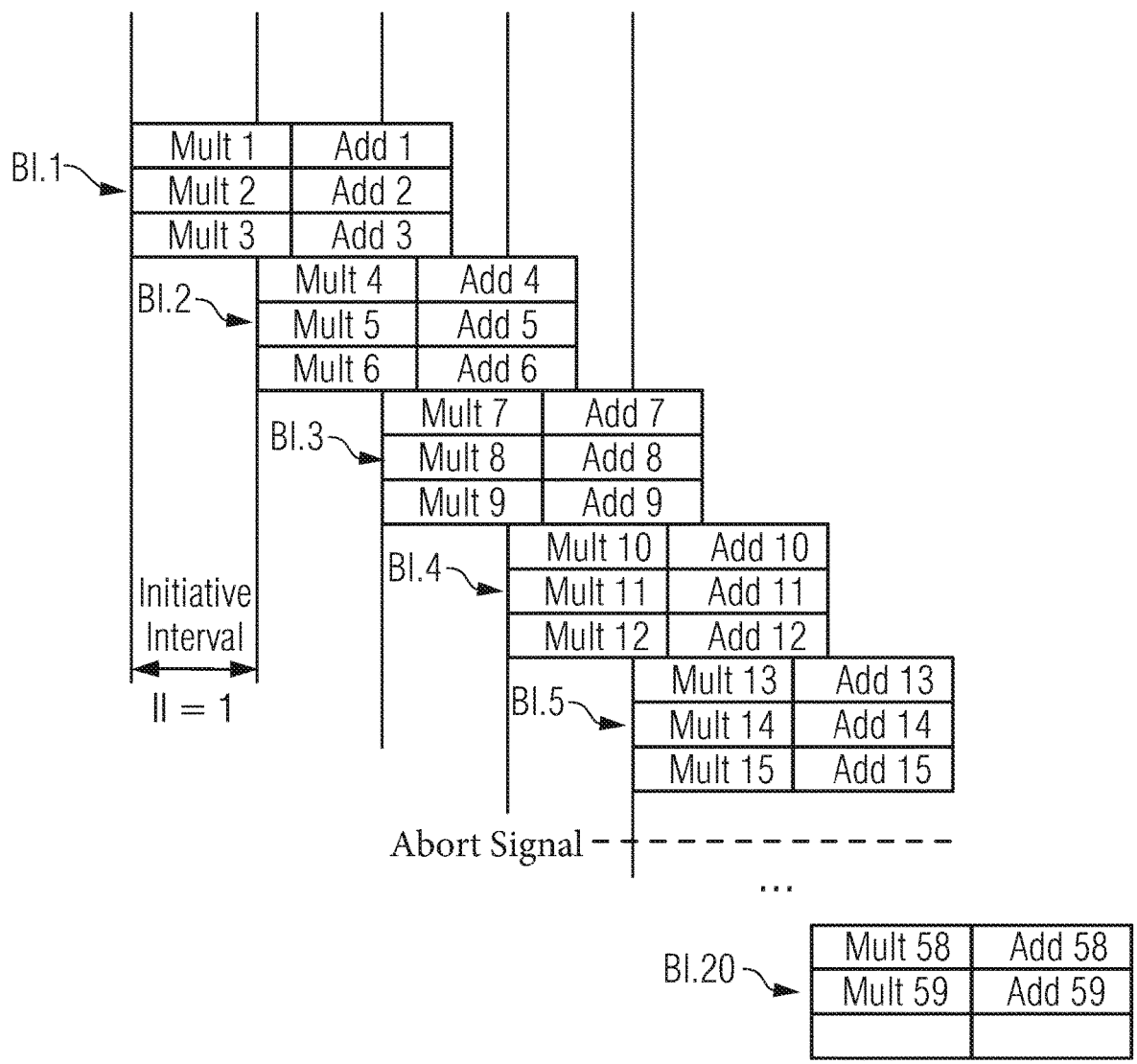
FIG. 7 shows a schematic representation of a block-by-block calculation including pipelining and an abort option.

FIG. 7 schematically shows a block-by-block calculation including pipelining and an abort option. In the example shown, a block includes 3 rows, which is here illustrated by 3 boxes located one below another. The reading of the data from the memory and the multiplication and addition thereof can be performed in parallel for the data of a row or block. Each multiplication is followed by an addition, which is implemented by an adder tree including a plurality of stages. A multiplication box, such as, for example, "Mult 1", includes all multiplications of a row by the vector, and an adding box "Add 1" includes an adder tree that adds up all values of this row. In an exemplary embodiment, the blocks are read out in a pipelined manner, the number of blocks that are to be read from the memory being controllable via the input signal. Conveniently, this signal may at the same time serve as an abort signal in the row direction.

Figure 8:
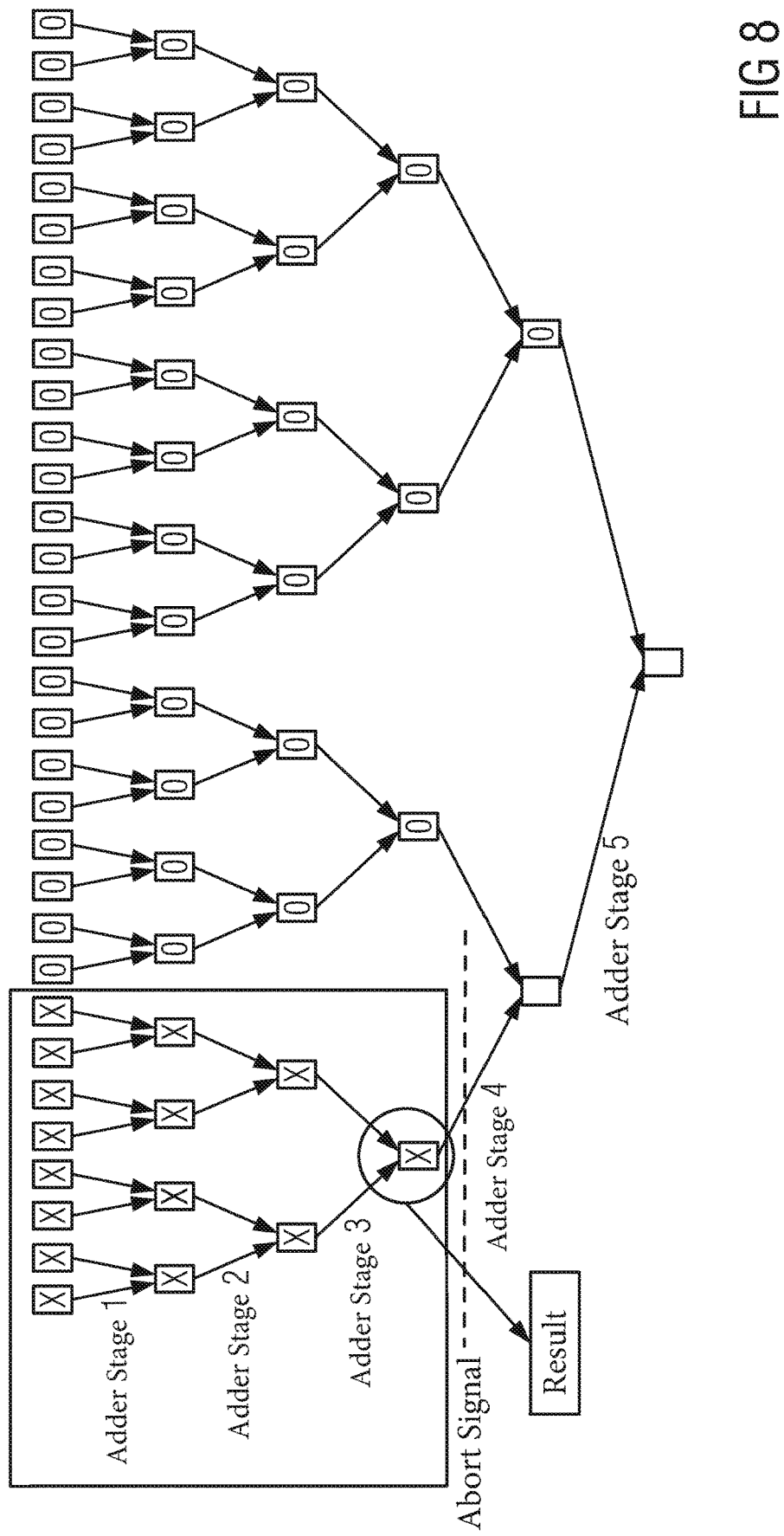
FIG. 8 shows a schematic representation of an adder tree having an abort option.

FIG. 8 shows a schematic diagram of an adder tree having an abort option, which adds up the values of a row (or block). The number of required stages is dependent on the number of elements in a block (or row). In the case of a smaller number of columns, the result is available earlier because it will not change in the further adder stages (which only add additional zeros). In an exemplary embodiment, the adder stages of the adder tree may be implemented using VIVADO HLS. In an exemplary embodiment, the connection between all adder stages is implemented in XSG. A done signal is implemented after each adder stage to indicate that an adder stage is done with the calculation. The number of adder stages needed for the calculation varies depending on the number of columns required. The outputting of a done signal by the predetermined required adder stage may serve as an abort criterion in the column direction (in this respect, the done signal would also be an abort signal).

A first example of a circuit to be simulated is a single-phase three-level converter, which, in real applications, is used in the area of power electronics. In the following, it will be used as a basis for a more detailed description of the method presented here. Using the fixed nodal approach (FNA), a matrix having the dimensions 60×23 is created from the upper circuit, which matrix describes the dynamics and outputs of the circuit. In order to calculate the outputs, the matrix is multiplied by a vector that contains the input values and initialization values. An FPGA build is generated based on the matrix dimension 60×23. This FPGA build can then also be used for all other circuits less than or equal to the maximum dimensions.

A second example of a circuit to be simulated is a circuit for charging and discharging a capacitor, which is an example of a smaller circuit that can be simulated with shorter cycle times using a method according to an exemplary embodiment of the invention. From this circuit, a smaller matrix having the dimensions 15×8 can be generated in an automated manner, which matrix can be calculated using the same FPGA configuration.

In order to illustrate the effect of exemplary embodiments of the inventive method, several simulations were performed using a programmable logic device, namely a Xilinx Kintex-7 410T. The table below illustrates, by way of example, the improvements in cycle time that may be achieved according to the inventive method when using the same FPGA configuration for a simulation of the larger circuit and the smaller circuit:

| Type | #Rows | #Columns | #Blocks | #Stages | Clock cycles |
|---|---|---|---|---|---|
| Maximum dimension 60 × 23 | | | | | |
| old | 60 | 23 | 60 | 5 | 79 |
| | 15 | 8 | 60 | 5 | 79 |
| new | 60 | 23 | 20 | 5 | 39 |
| | 15 | 8 | 5 | 3 | 16 |
| Maximum dimension 300 × 150 | | | | | |
| old | 300 | 150 | 300 | 8 | 331 |
| | 15 | 8 | 300 | 8 | 331 |
| new | 300 | 150 | 100 | 8 | 131 |
| | 15 | 8 | 5 | 3 | 16 |

The term "old" is used here to refer to a calculation according to the prior art: Based on fixed matrix dimensions of 60×23, the calculation for the entire matrix takes as long as for only a small portion having the dimensions 15×8, namely 79 clock cycles. The term "new" is used here to refer to a calculation including parallel processing of blocks and aborting after the required adder stage: By partitioning the matrix into blocks alone, only 39 cycles are needed, so the required time is approximately halved. By reducing the portions to be calculated based on the abort criteria, the cycle time is further reduced to 16 clock cycles. Thus, in the case of a configuration with a fixed maximum dimension of 60×23, the time required for the smaller matrix of the dimension 15×8 is reduced to 20% of the previously required time ("old").

For even larger matrix dimensions, the performance increase is even more noticeable, as can be seen in the example of a matrix having the dimensions 300×150. A block-by-block parallel processing of blocks of 3 rows alone reduces the cycle time to 40% of the initial value. By aborting the calculations based on the required adder stage or an abort signal, the time required can here be reduced to less than 10% of the previously required time ("old").

The clock cycles required for the calculation can be determined by the equation $$\text{\#clock cycles} = A + (\text{\#blocks} - 1) + B * \text{\#adder stages},$$

where A and B are constants. The constants may depend on the type of the programmable logic device and, possibly, on the type of implementation. In the example shown, A is equal to 4 and B is equal to 4. In an exemplary embodiment, a simulation method includes automatic setting of the cycle time based on the required clock cycles. Thus, exemplary embodiments of the present invention allow smaller circuits to be simulated with significantly reduced cycle times without having to create a specialized FPGA configuration each time.

While embodiments of the invention have been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A method for computer-based simulation or control of a dynamic system using a computer, wherein behavior of the dynamic system corresponds to at least one system equation, wherein the computer includes a programmable logic device, wherein a configuration of the programmable logic device includes:
a parallel multiplication of blocks of at least two elements of a matrix by at least one input-signal-dependent element of a vector, and
an adder tree for multiplication results,
wherein successive blocks of the matrix are temporarily stored in a pipeline and processed sequentially,
wherein the method comprises:
cyclically receiving, by the programmable logic device, at least one input signal;
calculating, by the programmable logic device, at least one matrix multiplication;
terminating, by the programmable logic device, processing of blocks for a current cycle upon a target number of blocks and a target adder stage being reached, wherein the target number of blocks and the target adder stage are based on a number and/or values of parameters of the at least one system equation;
determining, by the programmable logic device, at least one output signal based on a result of the target adder stage; and
outputting, by the programmable logic device, the at least one output signal.

2. The method according to claim 1, wherein the at least one system equation is predefined via a graphical model, and wherein the at least two elements of the matrix are defined by the at least one system equation and/or the graphical model.

3. The method according to claim 1, wherein a data type of the at least one input signal and/or a data type of the at least one output signal and/or a data type of the at least two elements of the matrix are a floating-point type.

4. The method according to claim 1, wherein the configuration of the programmable logic device is predefined as a fixed configuration and usable for matrices up to a set of maximum dimensions.

5. The method according to claim 1, wherein attainment of the target number of blocks and/or the target adder stage is detected based on an abort signal.

6. The method according to claim 5, wherein the abort signal is transmitted between individual functional blocks of the configuration.

7. The method as recited in claim 5, wherein the target number of blocks and/or the target adder stage and/or a size parameter are stored in an internal memory of the programmable logic device, and wherein at least one functional block generates the abort signal in accordance with the target number of blocks and/or the target adder stage and/or the size parameter.

8. A computer system comprising:
an operator computer having a human-machine interface; and
a working computer, the working computer including a processor and a programmable logic device;
wherein a configuration of the programmable logic device includes:
a parallel multiplication of blocks of at least two elements of a matrix by at least one input-signal-dependent element of a vector, and
an adder tree for multiplication results;
wherein the programmable logic device is configured to at least temporarily store successive blocks of the matrix and to process the successive blocks sequentially in a pipeline;
wherein the programmable logic device is further configured to:
cyclically receive at least one input signal;
calculate at least one matrix multiplication;
terminate processing of blocks for a current cycle upon a target number of blocks and a target adder stage being reached, wherein the target number of blocks and the target adder stage are based on a number and/or values of parameters of the at least one system equation;
determine at least one output signal based on a result of the target adder stage; and
output the at least one output signal.

9. A non-transitory computer-readable storage medium having stored thereon a configuration for a programmable logic device, wherein the configuration of the programmable logic device includes:
a parallel multiplication of blocks of at least two elements of a matrix by at least one input-signal-dependent element of a vector, and
an adder tree for multiplication results, wherein the configuration for the programmable logic device configures the programmable logic device to temporarily store successive blocks of the matrix and process the successive blocks of the matrix sequentially;

wherein the configuration, when executed by the programmable logic device, facilitates performance of the following by the programmable logic device:

cyclically receiving at least one input signal, receiving at least one size parameter, determining a target number of blocks and a target adder stage in accordance with the at least one size parameter, calculating at least one matrix multiplication, terminating processing of blocks for a current cycle upon the target number of blocks and the target adder stage being reached, determining at least one output signal based on a result of the target adder stage, and outputting the at least one output signal.

10. The non-transitory computer-readable storage medium according to claim 9, wherein the configuration, when executed by the programmable logic device, facilitates performance of the following by the programmable logic device: storing the at least two elements of the matrix and/or the at least one size parameter and/or the target number of blocks and/or the target adder stage in an internal memory.

11. The non-transitory computer-readable storage medium according to claim 9, comprising at least one non-volatile memory device electrically connected to the programmable logic device.

* * * * *